(12) United States Patent
Seo (10) Patent No.: US 7,295,038 B2
(45) Date of Patent: Nov. 13, 2007

(54) DIGITAL CIRCUITS HAVING CURRENT MIRRORS AND REDUCED LEAKAGE CURRENT

(75) Inventor: Jin-Ho Seo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 118 days.

(21) Appl. No.: 11/204,111

(22) Filed: Aug. 15, 2005

(65) Prior Publication Data
US 2006/0033530 A1    Feb. 16, 2006

(30) Foreign Application Priority Data
Aug. 16, 2004    (KR) ............... 10-2004-0064237

(51) Int. Cl.
*H03K 19/0175* (2006.01)
(52) U.S. Cl. .......................... 326/81; 326/68
(58) Field of Classification Search ............ 326/80–83, 326/86, 68
See application file for complete search history.

(56) References Cited
U.S. PATENT DOCUMENTS
6,480,050 B1 * 11/2002 Barnes .................. 327/333

| 7,034,573 | B1 * | 4/2006 | Chang ................... 326/68 |
| 7,112,998 | B2 * | 9/2006 | Ajit ...................... 326/81 |
| 2002/0009013 | A1 | 1/2002 | Lee ................. 365/230.06 |
| 2002/0084802 | A1 | 7/2002 | Elamanchili et al. ...... 326/68 |

FOREIGN PATENT DOCUMENTS

| JP | 07-086913 | 3/1995 |
| JP | 07086913 A | 3/1995 |
| KR | 1997-0053879 | 7/1997 |
| KR | 10-2002-9765 | 2/2002 |

OTHER PUBLICATIONS

Notice to Submit a Response for Korean Patent Application No. 10-2004-0064237 mailed on Mar. 31, 2006.

* cited by examiner

*Primary Examiner*—James H. Cho
(74) *Attorney, Agent, or Firm*—Myers Bigel Sibley & Sajovec, P.A.

(57) ABSTRACT

A digital circuit such as a level shifter circuit includes a current mirror having first and second current supply transistors configured to provide an output signal to an output node based on an input signal. A leakage current control circuit is configured to maintain the first and second current supply transistors in an off state in response to the output signal. An output compensation circuit coupled to the output node is configured to maintain a voltage level of the output node based on a level of output signal.

70 Claims, 7 Drawing Sheets

DIGITAL CIRCUITS HAVING CURRENT MIRRORS AND REDUCED LEAKAGE CURRENT

CROSS-REFERENCE TO RELATED APPLICATION

This application claims priority under 35 U.S.C. § 119 to Korean Patent Application No. 2004-64237 filed on Aug. 16, 2004 in the Korean Intellectual Property Office (KIPO), the disclosure of which is hereby incorporated by reference in its entirety.

FIELD OF THE INVENTION

The present invention relates to digital circuits, and in particular to digital circuits having current mirror structures.

BACKGROUND

Digital circuits employing CMOS (Complementary Metal Oxide Semiconductor) technology may consume a small enough current during the static or off state that they may be effectively ignored. Thus, CMOS digital circuits having a relatively low power consumption have been used in mobile devices. Likewise, input/output circuits may benefit from having a level shifter circuit whose power consumption is relatively low.

A level shifter circuit having a current mirror configuration may generate a non-negligible amount of leakage current during the static or "off" state. For example, a level shifter circuit is disclosed in Japanese Patent Application Publication Number JP07-086913. While the leakage current of the level shifter circuit disclosed in Japanese Patent Application Publication Number JP07-086913 may be reduced, such a circuit may nevertheless generate a non-negligible leakage current.

Figure 1:
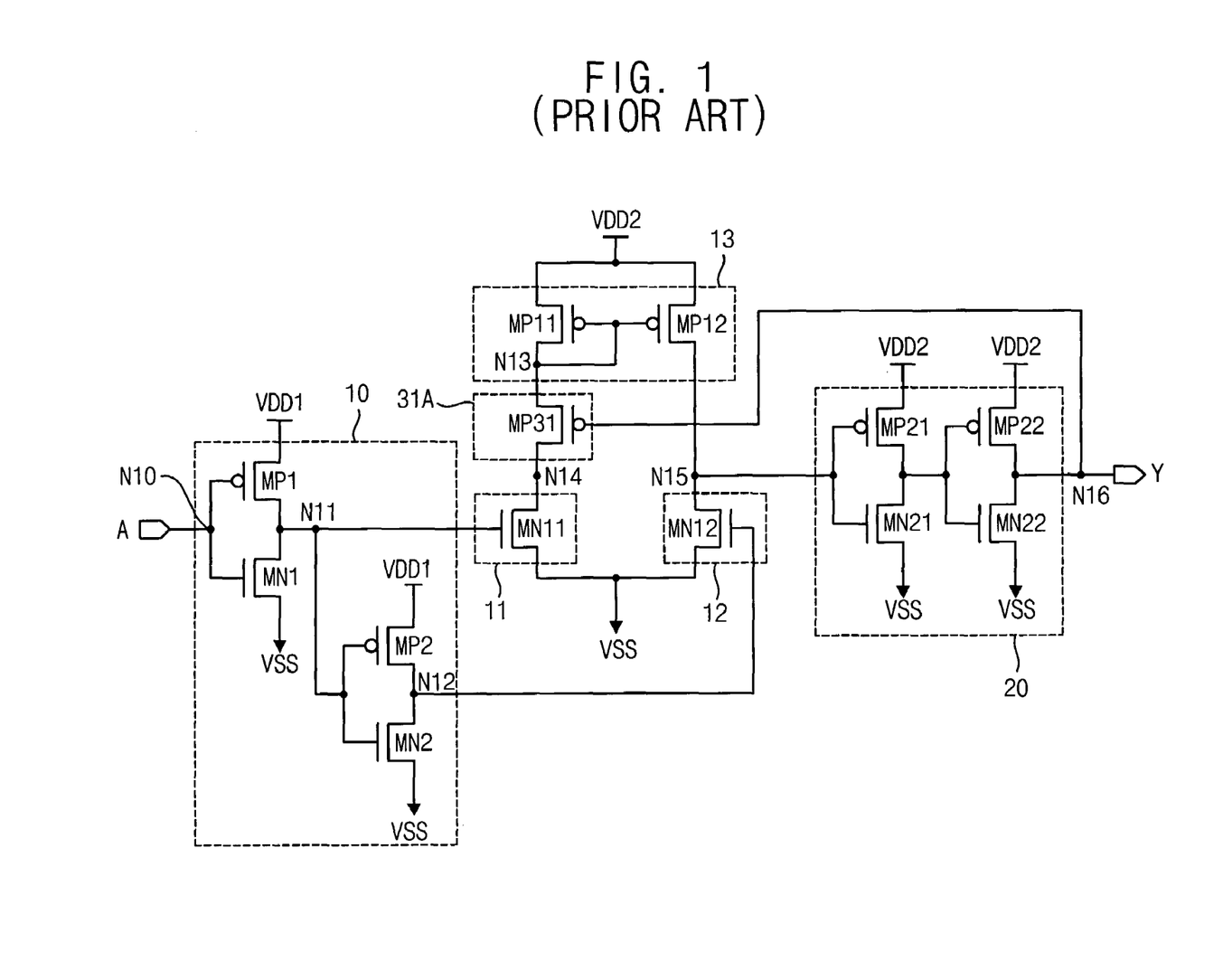
FIG. 1 is a circuit diagram illustrating a conventional level shifter circuit.
Figure 2:
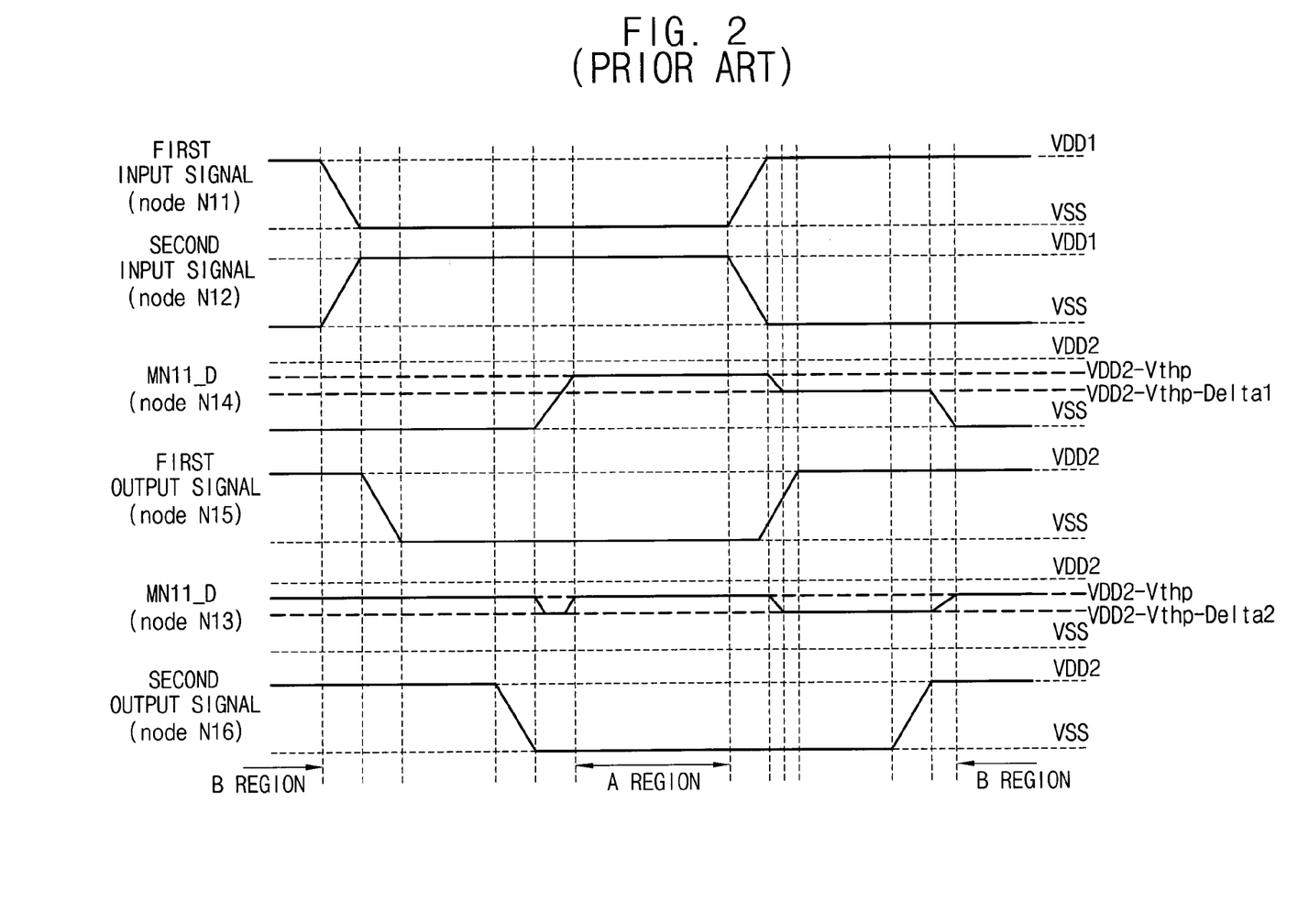
FIG. 2 is a timing diagram showing waveforms of input signals, output signals and nodes for the circuit shown in FIG. 1.

FIG. 1 is a circuit diagram illustrating a conventional level shifter circuit, and FIG. 2 is a timing diagram showing voltage waveforms of input signals, output signals and nodes for the circuit shown in FIG. 1.

Referring to FIG. 1, an input buffer 10 includes a two-stage inverter and generates a first input signal (node N11) that is inverted with respect to a preliminary input signal at node N10, and a second input signal (node N12) that is inverted with respect to the first input signal at node N11.

The first input signal (node N11) is provided to a first switching circuit 11, and the second input signal is provided to a second switching circuit 12. The first switching circuit 11 and the second switching circuit 12 may include a first NMOS transistor MN11 and a second NMOS transistor MN12, respectively, which may function as switching transistors.

A level control circuit 13 includes a first PMOS transistor MP11 and a second PMOS transistor MP12 connected in a current mirror configuration. The first PMOS transistor MP11 and the second PMOS transistor MP12 may function as current supply transistors in the current mirror.

A third PMOS transistor MP31 located between the first NMOS transistor MN11 and the first PMOS transistor MP11 may be turned off in order to shut off a constant current flow following a predetermined delay after the first NMOS transistor MN11 is turned on.

An output terminal (node N15) coupled to a junction of the second NMOS transistor MN12 and the second PMOS transistor MP12 outputs a first output signal.

The first output signal passes through an output buffer 20 including serial inverters to generate a final output signal i.e., a second output signal at a node N16.

Referring to FIG. 2, at the outset of the timing diagram (i.e. in the "B" region), the first input signal of node N11 has a high level, the second input signal at node N12 has a low level, and the second output signal at node N16 has a high level.

At this time, the first NMOS transistor MN11 is in the on-state, and the second NMOS transistor MN12 is in the off-state. Because the second output signal (node N16) has a high level, the third PMOS transistor MP31 assumes an off-state. Thus, the flow of current from the current mirror 13 to the first NMOS transistor MN11 is blocked.

Because the first NMOS transistor MN11 is in an on-state in the B-region as shown in FIG. 2, the drain (node N14) of the NMOS transistor MN11 assumes a low level.

Because the third PMOS transistor MP31 is in the off-state, the drain (node N13) of the first PMOS transistor MP11 assumes a high level. However, the maximum voltage on the drain of the first PMOS transistor MP11 is not the power supply voltage VDD2. Rather, the maximum voltage of the drain of the first PMOS transistor MP11 is equal to the supply voltage VDD2 less the PMOS threshold voltage (VDD2−Vthp).

The reduced voltage (VDD2−Vthp) is applied to the gate of the second PMOS transistor MP12, causing the second PMOS transistor MP12 to be in an off-state.

Because the second NMOS transistor MN12 is in the off-state, the first output signal of the output terminal N15 has a high level, and the second output signal (node N16) outputted from the output buffer 20 accordingly has a high level.

However, the first output signal at terminal node N15 may not maintain its high level due to a difference between leakage currents of the second NMOS transistor MN12 and the second PMOS transistor MP12. In particular, if the leakage current of the second NMOS transistor MN12 is larger than the leakage current of the second PMOS transistor MP12, the first output signal at node N15, initially having a high level, may decrease from the supply voltage VDD2, and the leakage current of the fourth PMOS transistor MP21, which forms part of the first inverter of the output buffer 20, may increase to a significantly large value.

If the first output signal at node N15 having a high level is lower than the threshold voltage of the fourth PMOS transistor MP21, the third NMOS transistor MN21 and the fourth PMOS transistor MP21 forming the first inverter of the output buffer 20 may both be turned on or partially on, thereby permitting a relatively large leakage current to flow therethrough.

Accordingly, when the first input signal (node N11) has a high level and the second input signal (node N12) has a low level (i.e. in the B region), it may be desirable to maintain the first output signal at the high level (VDD2) in order to reduce leakage currents.

As shown in FIG. 2, when the first input signal at node N11 is changed to a low level from a high level, the first NMOS transistor MN11 is turned off and the second NMOS transistor MN12 is turned on. Because the second NMOS transistor MN12 is turned on, the first output signal at node N11 is changed to a low level and the output buffer 20 outputs a low level as the second output signal after a predetermined switching delay.

The gate of the third PMOS transistor MP31 is coupled to the second output signal. Thus, when the second output signal switches to a low level, the third PMOS transistor MP31 is turned on and the drain voltage of the first NMOS transistor MN11 (node N14) is pulled-up to the reduced voltage level (VDD2−Vthp).

At the same time, the drain voltage of the first PMOS transistor MP11 (node N13) temporarily falls from the reduced voltage level (VDD2−Vthp) and rises again to the reduced voltage level (VDD2−Vthp).

If the drain voltage of the first PMOS transistor MP11 (node N13) is slightly larger than the reduced voltage level (VDD2−Vthp), the first PMOS transistor MP11 will be automatically turned off. Thus, it may be difficult or impossible for the drain voltage of the first PMOS transistor MP11 to rise to a voltage level larger than or equal to the reduced voltage level (VDD2−Vthp).

Additionally, the gate of the first PMOS transistor MP11 and the gate of the second PMOS transistor MP12, which are commonly coupled to the drain of the first PMOS transistor MP11, have the voltage level (VDD2−Vthp). As a result, the gate voltage of the second PMOS transistor MP12 has the voltage level (VDD2−Vthp), which is lower than the voltage level VDD2. Thus, the second PMOS transistor MP12 may not be completely turned off, which may result in the fist PMOS transistor MP11 having a relatively large leakage current.

When the second PMOS transistor MP12 is at the sub-threshold voltage level, the second PMOS transistor MP12 may generate a leakage current similar to the relatively large leakage current described above.

If the threshold voltage of the second PMOS transistor MP12 is lower than the threshold voltage of the first PMOS transistor MP11, the second PMOS transistor MP12 may experience a leakage current proportional to the square of the difference between the threshold voltages of the first PMOS transistor MP11 and the second PMOS transistor MP12.

In sum, when the first output signal (node N15) has a high level, it may be desirable to continuously maintain the first output signal (node N15) at the high level so that leakage current from the output buffer 20 may be reduced.

Additionally, when the first output signal has a low level, it may be desirable to reduce leakage current from the second PMOS transistor MP12.

SUMMARY

Some embodiments of the invention provide a digital circuit including first and second input nodes, a power supply terminal having a power supply voltage, and first and second switching transistors having a common source configuration. The first switching transistor has a control terminal coupled to the first input node and the second switching transistor has a control terminal coupled to the second input node. The states of the first and second switching transistors are switched in response to a first input signal at the first input node and an inverted first input signal at the second input node. A current mirror including a first current supply transistor having a control electrode and having a current terminal coupled to the power supply terminal and a second current supply transistor having a control electrode coupled to the control electrode of the first transistor and having a current terminal coupled to the power supply terminal provides a first output signal to a first output node based on a state of the first switching transistor and a complementary state of the second switching transistor.

In a digital circuit according to some embodiments of the invention, a leakage current control circuit is coupled to the output node and the current mirror and is configured to maintain the first current supply transistor and the second current supply transistor of the current mirror in an off state by providing the power supply voltage to the control electrodes of the first current supply transistor and the second current supply transistor in response to the first output signal.

In some embodiments of the invention, the first switching transistor and/or the second switching transistor may include an NMOS transistor, and/or the first current supply transistor and/or the second current supply transistor may include a PMOS transistor.

In some embodiments of the invention, the leakage current control circuit may include a PMOS transistor having a gate terminal coupled to the first output node, a source terminal coupled to the power supply terminal, and a drain terminal coupled to the control terminals of the first and second current supply transistors.

Some embodiments of the invention further include an output buffer coupled to the first output node and configured to provide a delayed output signal to a second output node. A current switch may be coupled between the first switching transistor and the first current supply transistor. The current switch may be configured to switch a current from the current mirror in response to a level of the delayed output signal. In some embodiments of the invention, the current switch may include a transistor having a first current terminal coupled to the first current supply transistor, a second current terminal coupled to the first switching transistor, and a control terminal coupled to the second output node.

In some embodiments of the invention, the current switch includes a PMOS transistor. In further embodiments of the invention, the current switch includes an NMOS transistor and the delayed output signal is delayed and inverted with respect to the first output signal.

Some embodiments of the invention further include an output compensation circuit coupled to the output node and configured to maintain a voltage level of the first output node based on a level of the first output signal.

In some embodiments of the invention, a digital circuit further includes an output buffer coupled to the first output node that is configured to provide a delayed and inverted output signal to a second output node. The output compensation circuit may be configured to supply a voltage to the first output node in response to a level of the delayed and inverted output signal.

In some embodiments of the invention, the output compensation circuit may include a PMOS transistor having a source coupled to the power supply terminal, a drain coupled to the first output node and a gate coupled to the second output node. In further embodiments of the invention, the output compensation circuit may include an inverter circuit having an input coupled to the second output node and an output coupled to the first output node. In still further embodiments of the invention, the output compensation circuit may include a pair of inverter circuits connected in an anti-parallel configuration to form a bus holder circuit.

A digital circuit according to some embodiments of the invention includes first and second input nodes, a power supply terminal having a power supply voltage, and first and second NMOS transistors connected in a common source configuration. The first NMOS transistor may have a gate coupled to the first input node and the second NMOS transistor may have a gate coupled to the second input node and a drain coupled to a first output node. A first PMOS transistor has a gate, a source terminal coupled to the power supply terminal, and a drain coupled to a drain of the first NMOS transistor and to the gate of the first PMOS transistor.

A second PMOS transistor has a gate coupled to the gate of the first PMOS transistor, a source coupled to the power supply terminal, and a drain coupled to the first output node. A third PMOS transistor has a source coupled to the power supply terminal, a drain coupled to the gates of the first and second current supply transistors and a gate coupled to the first output node.

Some embodiments of the invention further include a first inverter having an input coupled to the first output node and an output coupled to a second output node, and a fourth PMOS transistor having a source coupled to the power supply terminal, a drain coupled to the first output node and a gate coupled to the second output node.

Further embodiments of the invention may include a first inverter having an input coupled to the first output node and an output coupled to a second output node and a second inverter having an input coupled to the second output node and an output coupled to the first output node. In still further embodiments of the invention, a pair of inverters may be connected in an anti-parallel configuration and coupled to the first output node.

Some embodiments of the invention may further include a first inverter having an input coupled to the first output node and an output coupled to a second output node and a second inverter having an input coupled to the second output node and an output coupled to a third output node. A fourth PMOS transistor may have a source coupled to the drain of the first PMOS transistor, a drain coupled to the drain of the first NMOS transistor, and a gate coupled to the third output node.

Some embodiments of the invention may further include a first inverter having an input coupled to the first output node and an output coupled to a second output node and a third NMOS transistor having a drain coupled to the drain of the first PMOS transistor, a source coupled to the drain of the first NMOS transistor, and a gate coupled to the second output node.

A digital circuit in accordance with further embodiments of the invention includes first and second input nodes, a power supply terminal having a power supply voltage, and first and second NMOS transistors having a common source configuration. The first NMOS transistor may have a gate coupled to the first input node and the second NMOS transistor may have a gate coupled to the second input node and a drain coupled to a first output node. The digital circuit may include a first PMOS transistor having a gate, a source terminal coupled to the power supply terminal, and a drain coupled to a drain of the first NMOS transistor and to the gate of the first PMOS transistor. A second PMOS transistor may have a gate coupled to the gate of the first PMOS transistor, a source coupled to the power supply terminal and a drain coupled to the first output node. An output compensation circuit may be coupled to the first output node and configured to maintain a voltage level of the first output node.

Some embodiments of the invention may further include a first inverter having an input coupled to the first output node and an output coupled to a second output node. The output compensation circuit may include a fourth PMOS transistor having a source coupled to the power supply terminal, a drain coupled to the first output node and a gate coupled to the second output node.

Further embodiments of the invention may include a first inverter having an input coupled to the first output node and an output coupled to a second output node. The output compensation circuit may include a second inverter having an input coupled to the second output node and an output coupled to the first output node.

In some embodiments of the invention, the output compensation circuit may include a first inverter having an input coupled to the first output node and a second inverter having an input coupled to an output of the first inverter and an output coupled to the first output node.

Further embodiments of the invention may include a first inverter having an input coupled to the first output node and an output coupled to a second output node and a second inverter having an input coupled to the second output node and an output coupled to a third output node. A fourth PMOS transistor may have a source coupled to the drain of the first PMOS transistor, a drain coupled to the drain of the first NMOS transistor and a gate coupled to the third output node.

Still further embodiments of the invention may include a first inverter having an input coupled to the first output node and an output coupled to a second output node and a third NMOS transistor having a drain coupled to the drain of the first PMOS transistor, a source coupled to the drain of the first NMOS transistor, and a gate coupled to the second output node.

Some embodiments of the invention provide a level shifter circuit including a first input node configured to receive an input signal having a signal level that switches between a first voltage level and a second voltage level. A first inverter has an input coupled to the input node and is configured to provide an inverted input signal at a second input node. A power supply terminal has a third voltage level different from the first and second voltage levels. A switching circuit includes a first switching transistor and a second switching transistor having a common source configuration. The first switching transistor has a control terminal coupled to the first input node and the second switching transistor has a control terminal coupled to the second input node. The states of the first switching transistor and the second switching transistor are switched in response to the input signal at the first input node and the inverted input signal at the second input node.

A level shifter circuit according to some embodiments of the invention includes a current mirror including a first current supply transistor having a control electrode and having a current terminal coupled to the power supply terminal and a second current supply transistor having a control electrode coupled to the control electrode of the first transistor and having a current terminal coupled to the power supply terminal. The current mirror may provide a first output signal switching between the second voltage level and the third voltage level to an output node based on a state of the first switching transistor and a complementary state of the second switching transistor.

In some embodiments of the invention, a level shifter circuit includes a leakage current control circuit coupled to the output node and the current mirror and configured to maintain the first current supply transistor and the second current supply transistor of the current mirror in an off state by providing the third voltage level to the control electrodes of the first current supply transistor and the second current supply transistor in response to the first output signal.

In embodiments of the invention, a level shifter circuit includes an output compensation circuit coupled to the output node and configured to maintain a voltage level of the output node based on a level of the first output signal.

A level shifter circuit according to some embodiments of the invention may include a first NMOS transistor and a second NMOS transistor having a common source configuration, the first NMOS transistor having a gate coupled to the first input node and the second NMOS transistor having a gate coupled to the second input node and a drain coupled to a first output node. In some embodiments of the invention, a level shifter circuit may include a first PMOS transistor having a gate, a source terminal coupled to the power supply terminal, and a drain coupled to a drain of the first NMOS transistor and to the gate of the first PMOS transistor, and a second PMOS transistor having a gate coupled to the gate of the first PMOS transistor and having a source coupled to the power supply terminal and a drain coupled to the first output node to thereby provide a first output signal to the first output node that switches between the second voltage level and the third voltage level.

In some embodiments of the invention, a level shifter circuit may include a third PMOS transistor having a source coupled to the power supply terminal, a drain coupled to the gates of the first and second PMOS transistors and a gate coupled to the first output node.

In further embodiments of the invention, a level shifter circuit may include an output compensation circuit coupled to the first output node and configured to maintain a voltage level of the first output node based on a level of the first output signal.

A level shifter circuit according to some embodiments of the invention including a power compensation circuit and/or an output compensation circuit may have reduced leakage currents in a level control circuit and/or an output buffer. Likewise, a digital circuit having a current mirror structure according to some embodiments of the invention may have reduced leakage currents.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
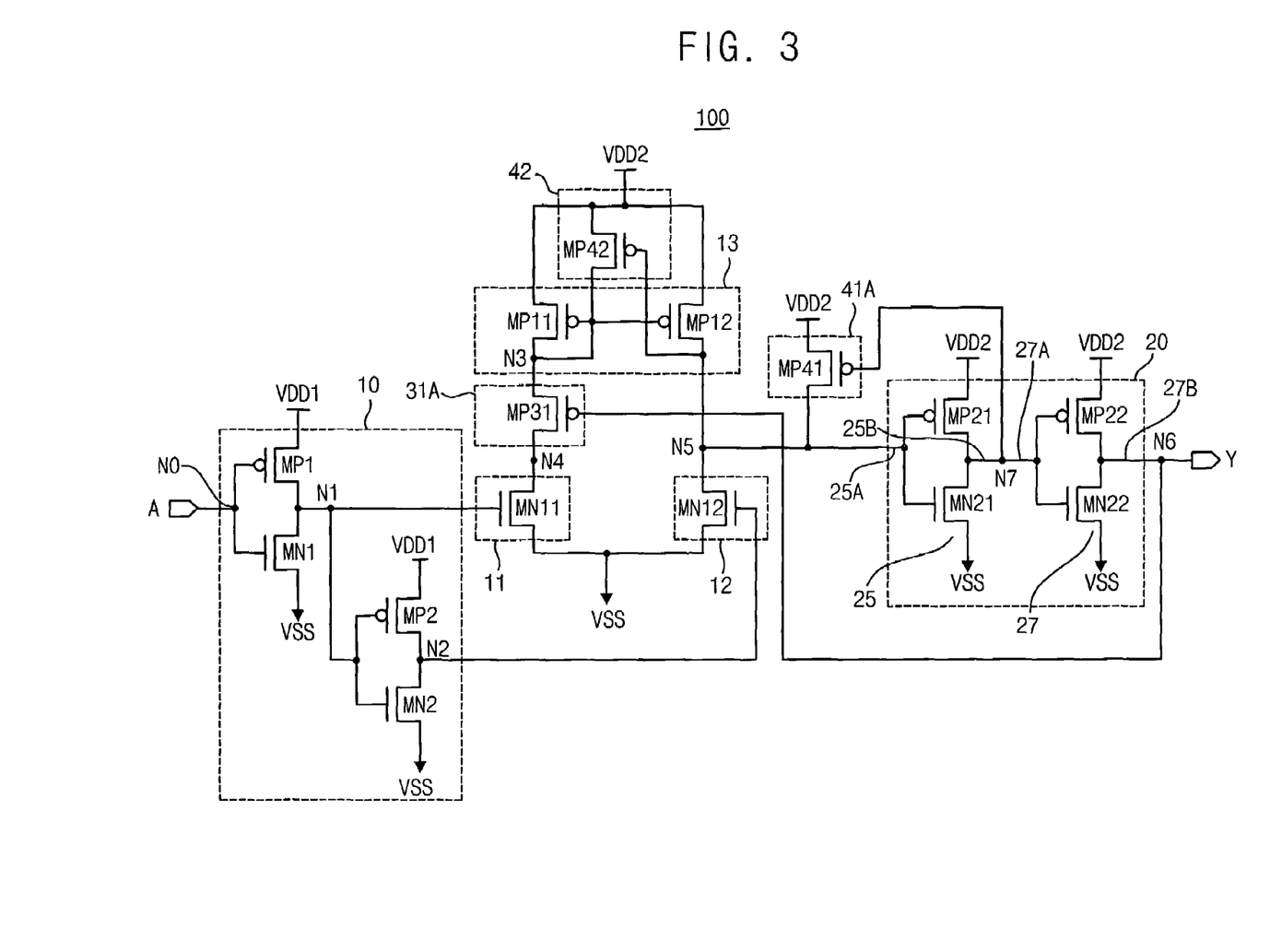
FIG. 3 is a circuit diagram illustrating a level shifter circuit according some embodiments of the invention.

FIG. 3 is a circuit diagram illustrating a level shifter circuit 100 according some embodiments of the invention. Referring to the embodiments of FIG. 3, the level shifter circuit 100 includes an input buffer 10, a first switching circuit 11, a second switching circuit 12, a third switching circuit 31A, a level control circuit 13 (having a current mirror configuration), an output buffer 20, an output compensation circuit 41A and a leakage current control circuit 42.

In detail, the input buffer 10 receives a preliminary input signal at node N0 and outputs a first input signal at node N1 and an inverted second input signal at node N2 that is inverted with respect to the level of the first input signal.

The first switching circuit 11 may include a switching transistor having a control terminal and a pair of current terminals. In particular embodiments of the invention, the first switching circuit 11 may include a first NMOS transistor MN11 and the second switching circuit 12 may include a second NMOS transistor MN12, having respective source, gate and drain terminals. As is understood in the art, a gate terminal of an MOS device may function as a control terminal of the device and the source and drain terminals may function as current terminals of the device.

The first NMOS transistor MN11 and the second NMOS transistor MN12 may be connected in a common source configuration as illustrated in FIG. 3. The level control circuit 13 may include a current mirror formed by a first PMOS transistor MP11 and a second PMOS transistor MP12. The gate and drain of the first PMOS transistor MP11 may be coupled to each other at node N3.

Additionally, the gates of the first PMOS transistor MP11 and the second PMOS transistor MP12 may be coupled to each other in a current mirror configuration.

The first and second PMOS transistors MP11 and MP12 of the current mirror of the level control circuit 13 may each have a source commonly coupled to a high power voltage supply VDD2. The level control circuit 13 may provide a first current signal to a first output node N5 corresponding to a mirror current of a second current signal provided to the node N3.

The third switching circuit 31A may include a third PMOS transistor MP31. The output buffer 20 receives the first output signal via node N5 and outputs a second output signal via the second output node N7 and a third output signal via the third output node N6. The second output signal at node N7 may also be referred to as a feedback signal, since the second output signal may be fed back into the circuit 100. The output buffer 20 may include a first inverter 25 having an input 25A coupled to the first output node N5 and an output 25B coupled to the second output node N7 and a second inverter 27 having an input 27A coupled to the second output node N7 and an output 27B coupled to the third output node N6.

The leakage current control circuit 42 may include a fourth PMOS transistor MP42. The output compensation circuit 41A may include a fifth PMOS transistor MP41.

The leakage current control circuit 42 may reduce leakage current from the level control circuit 13 by pulling up the gate voltages of the transistors MP11 and MP12 (node N3) in the level control circuit 13 to VDD2. The output compensation circuit 41A may reduce leakage current of the output buffer 20 by maintaining a first output signal (node N5) at a high level based on a level of the first output signal.

Figure 4:
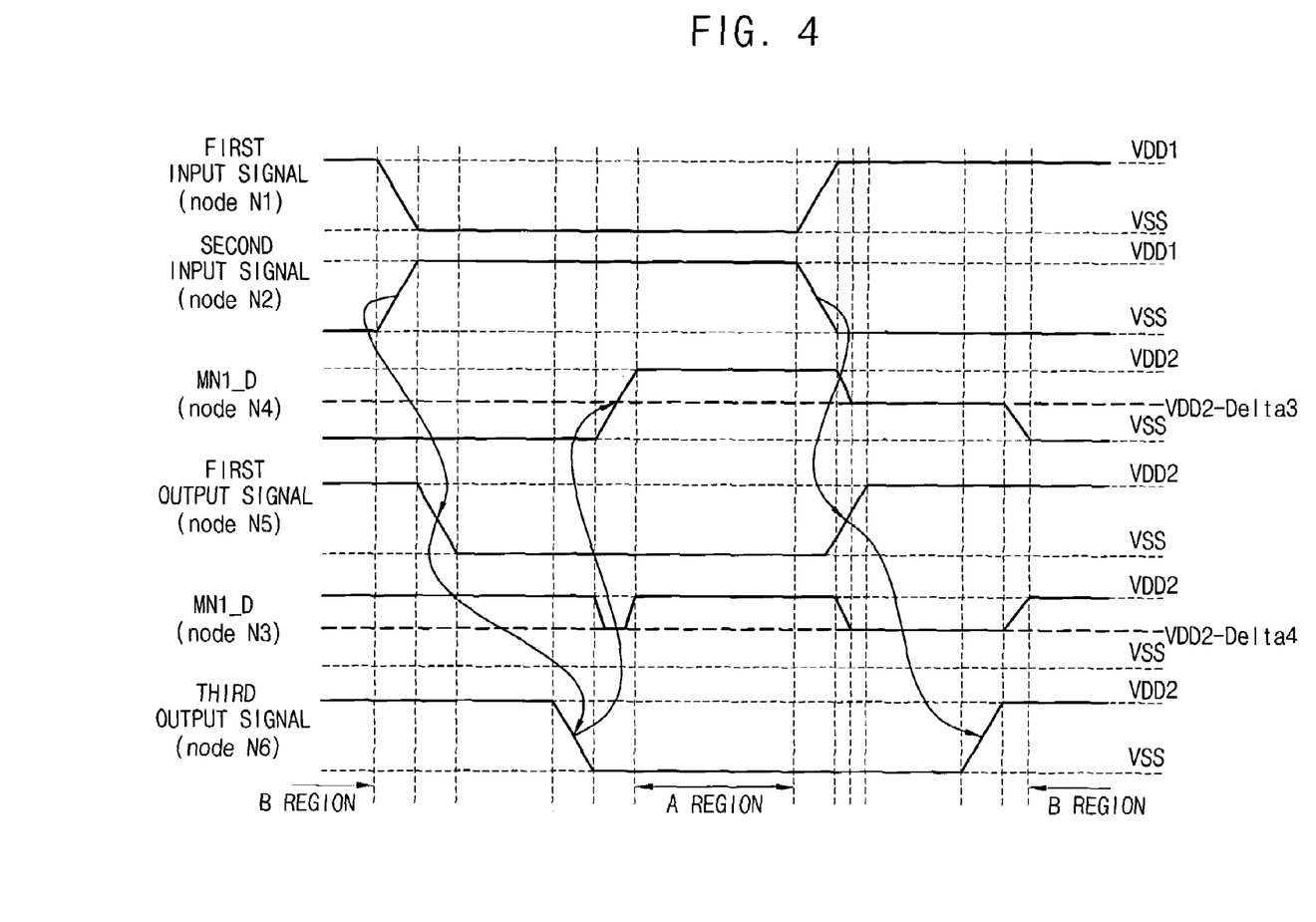
FIG. 4 is a timing diagram showing waveforms of input signals, output signals and nodes for the circuit shown in FIG. 3.

FIG. 4 is a timing diagram showing waveforms of input signals, output signals and nodes for the circuit 100 shown in FIG. 3. The operation of the level shifter circuit 100 of FIG. 3 may be understood with reference to the timing diagram of FIG. 4.

The operation of level shifter circuit 100 will be explained in the case where the preliminary input signal at node N0 has a low level (i.e. in the B-region). When the preliminary input signal at node N0 has a low level, the first input signal (node N1) has a high level (i.e. the first voltage level VDD1), the second input signal (node N2) has a low level (i.e. the second voltage level VSS), the first NMOS transistor MN11 is in the on-state, and the second NMOS transistor MN12 is in the off-state.

When the drain of the second NMOS transistor MN12 (i.e., the first output signal at node N5) is maintained at the level of the supply voltage VDD2, the feedback signal (node N7) output from a first inverter 25 of the output buffer 20 formed by a PMOS transistor MP21 and an NMOS transistor MN21, has a low level (VSS), and the second output signal (node N6) has a high level (VDD2).

Because the feedback signal at node N7 has a low level, the fifth PMOS transistor MP41 whose gate (node N7) is coupled to the feedback signal assumes an on-state, and the level at the first output node (node N5) has the power supply voltage level VDD2.

Although the voltage level of the first output signal (node N5) may fall slightly from the power voltage VDD2 due to leakage current of the second NMOS transistor MN12, the fifth PMOS transistor MP41 may be able to maintain the first output signal at the power supply voltage level VDD2 (B-region). As a result, leakage current of the output buffer 20, which may cause the voltage level of the first output signal at node N5 to become lower than the power supply voltage level VDD2, may be reduced.

Since the third output signal (node N6) has a high level, the third PMOS transistor MP31 is turned off, which shuts off the current path between the first NMOS transistor MN11 and the first PMOS transistor MP11. Thus, the drain of the first NMOS transistor MN11 (node N4) has a low level, and the drain of the first PMOS transistor MP11 (node N3) has a high level.

When the logic state of the preliminary input signal at node N0 is changed to a high level, the state of the first input signal at node N1 is changed to a low level (VSS) and the state of the second input signal at node N2 is changed to a high level (VDD1).

The first NMOS transistor MN11 is turned off in response to the first input signal at node N1 changing to a low level. Likewise, the second NMOS transistor MN12 is turned on in response to the second input signal at node N2 changing to a high level, thereby causing the voltage level at the first output node N5 to drop to a low level (VSS).

As the state of the feedback signal (node N7) is changed to a high level, the fifth PMOS transistor MP41 is turned off and the first output signal (node N5) changes to a low level.

Because the third output signal (node N6) assumes the same level as the first output signal (node N5) after a predetermined delay, the third output signal likewise assumes a low level.

After the third PMOS transistor MP31 coupled to the third output node N6 is turned on, the third PMOS transistor MP31 charges the drain of the first NMOS transistor MN11 (node N4) to thereby change the voltage on the drain of the first NMOS transistor MN11 to a high level.

Because the first output signal (node N5) has a low level, the fourth PMOS transistor MP42 is turned on, thereby providing the power supply voltage VDD2 to the gate of the first PMOS transistor MP11 and the gate of the second PMOS transistor MP12 (A region).

If the fourth PMOS transistor MP42 were not used, the gate voltage of the first PMOS transistor MP11 and the second PMOS transistor MP12 (i.e. the voltage at node N3) would be maintained at the voltage resulting from subtracting a threshold voltage of the PMOS transistors from the power supply voltage VDD2. Accordingly, without the fourth PMOS transistor MP42, leakage current corresponding to a sub-threshold voltage may flow through the second PMOS transistor MP12.

That is, if the threshold voltage of the second PMOS transistor MP12 is lower than the threshold voltage of the first PMOS transistor MP11, a leakage current proportional to the square of a difference between both of the threshold voltages may flow.

However, the fourth PMOS transistor MP42 may raise (or pull up) the gate voltage of the first PMOS transistor MP11 and the second PMOS transistor MP12 to the power voltage level VDD2. Thus, leakage current of the second PMOS transistor MP12 may be reduced.

When the level of the preliminary input signal at node N0 is changed to a low level, the first input signal (node N1) is changed to a high level (VDD1), and the inverted second input signal (node N2) is changed to a low level (VSS).

The first NMOS transistor MN11 is turned on by the first input signal at node N1. Accordingly, as the second NMOS transistor MN12 is turned off by the second input signal at node N2, the first output signal at node N5 is changed to a high level (VDD2). It will be appreciated that in a level shifter circuit, the voltage level VDD2 is different from the voltage level VDD1.

When the first output signal at node N5 changes to a high level, the third output signal at node N6 may still have a low level and the third PMOS transistor MP31 may remain in an on-state along with NMOS transistor MN11. Thus, some current may flow through both of the transistors MP31 and MN11. However, after a predetermined delay, the third output signal at node N6 changes to a high level, which changes the third PMOS transistor MP31 to the off-state, thereby blocking current from flowing through the first NMOS transistor MN11.

As described above, when the first input signal (node N1) has a high level and the second input signal (node N2) has a low level, the first output signal (node N5) is maintained at a high level by the fifth PMOS transistor MP41, which may effectively reduce leakage current of the output buffer 20.

Additionally, when the first input signal (node N1) has a low level and the second input signal (node N2) has a high level, the fourth PMOS transistor MP42 may provide the power voltage VDD2 to the gate of the second PMOS transistor MP12 to effectively reduce a leakage current of the second PMOS transistor MP12.

Figure 5:
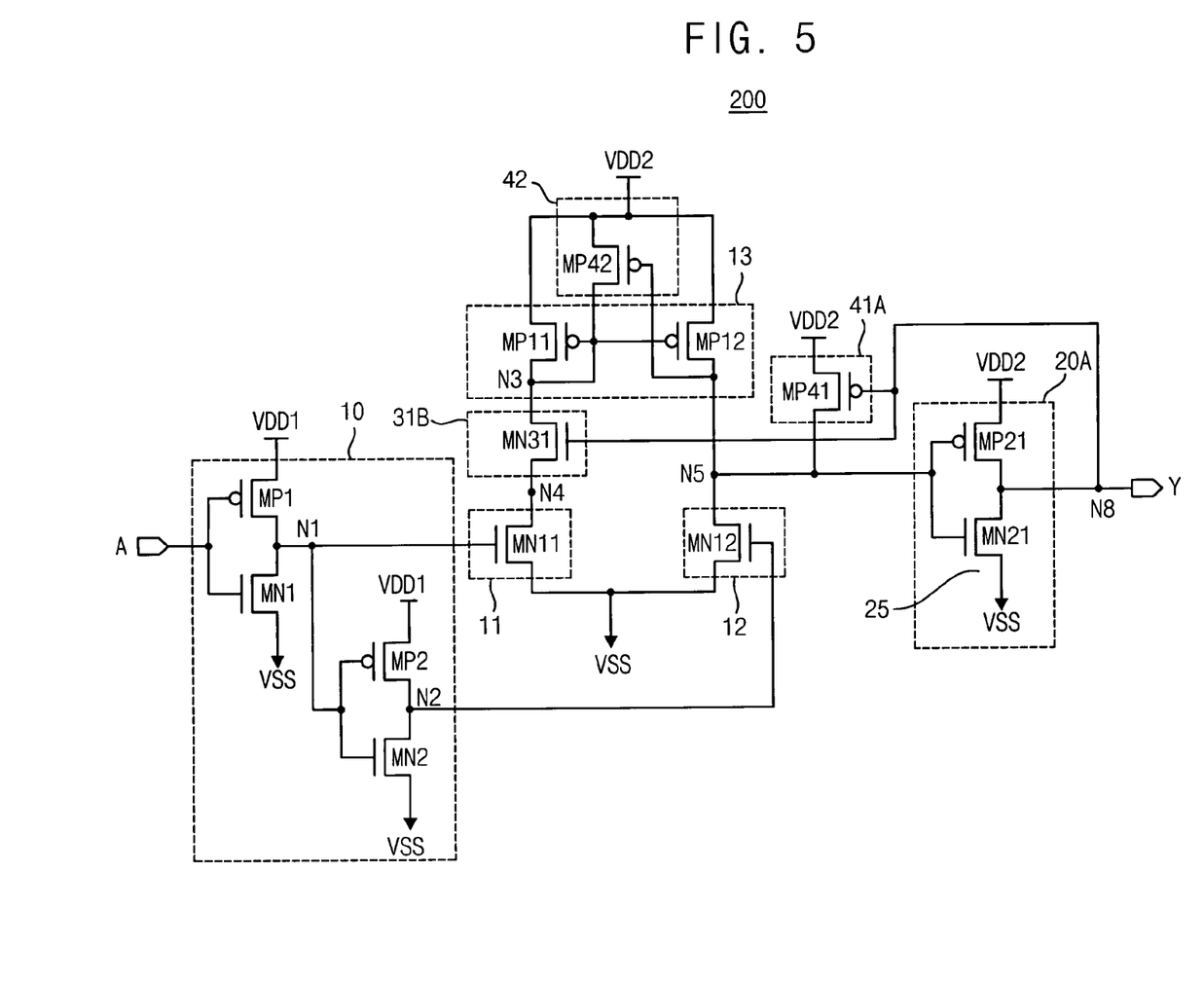
FIG. 5 is a circuit diagram illustrating a level shifter circuit according further embodiments of the invention.

FIG. 5 is a circuit diagram illustrating a level shifter circuit 200 according to further embodiments of the invention. Referring to the embodiments of FIG. 5, the level shifter circuit 200 includes an input buffer 10, a first switching circuit 11, a second switching circuit 12, a third switching circuit 31B, a level control circuit 13, an output buffer 20A, a leakage current control circuit 42 and an output compensation circuit 41A.

The level shifter circuit 200 of FIG. 5 includes some elements similar to elements of the level shifter circuit 100 of FIG. 3 except for the third switching circuit 31B and the output buffer 20A. Accordingly, descriptions of the function and operation of the elements included in the level shifter of FIG. 5 that are in common with those of the level shifter circuit 100 of FIG. 3 may be omitted.

The third switching circuit 31B includes an NMOS transistor MN31. The output buffer 20A, which in the embodiment illustrated in FIG. 5 includes a single inverter 25 receives a first output signal from a node N5 and outputs a second, delayed output signal at node N8.

The operation of the level shifter circuit 200 shown in FIG. 5 is similar to the operation of the level shifter circuit 100 shown in FIG. 3, except that the level shifter circuit 200 of FIG. 5 may have a reduced chip area because of the reduced number of inverters in the output buffer 20A.

Because the number of inverters may be reduced, the phase of the second output signal at node N8 may be changed, and the third switching circuit 31B where the second output signal is fed back may employ an NMOS transistor MN31 instead of a PMOS transistor MP31 as in the level shifter circuit 100 of FIG. 3.

Figure 6:
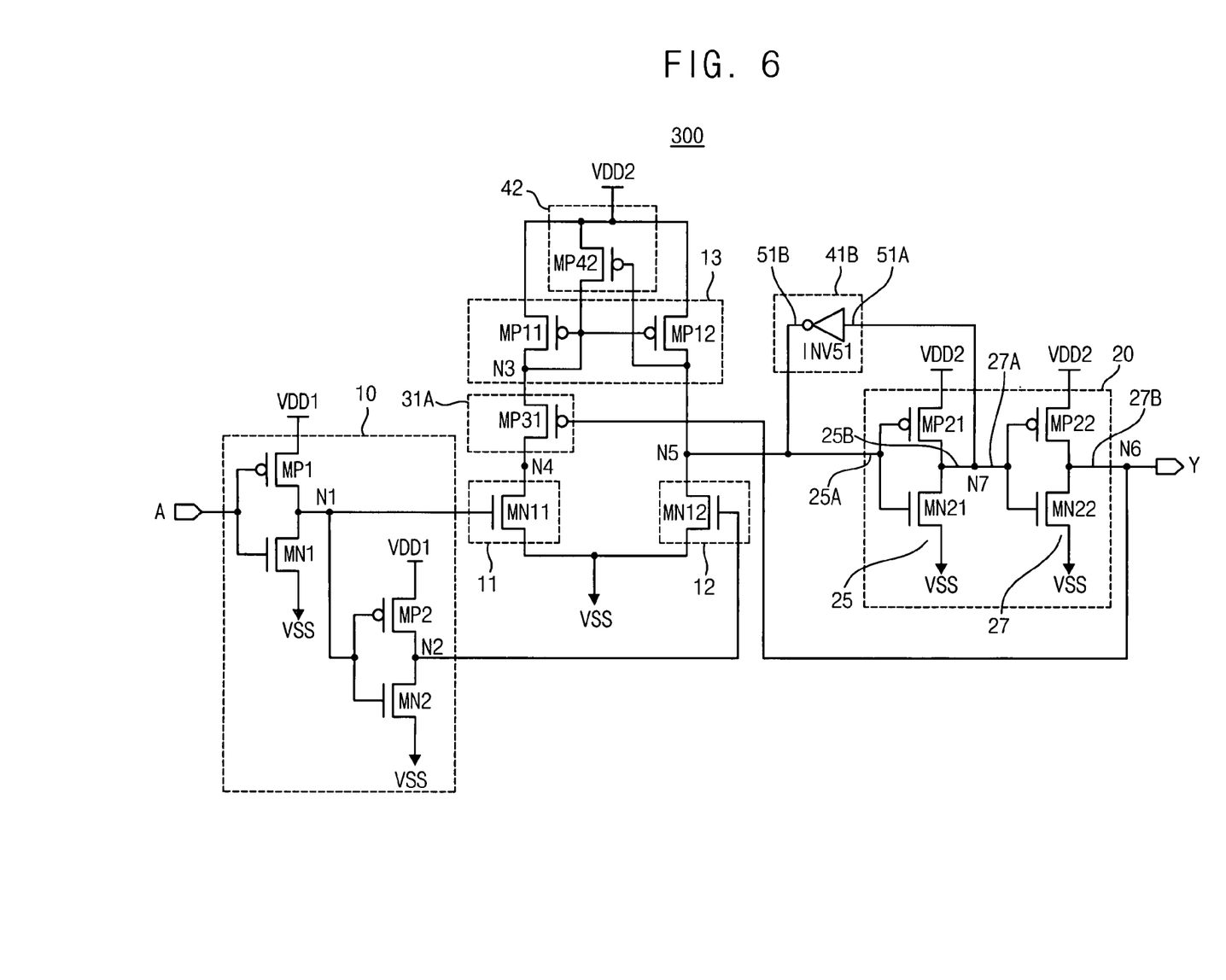
FIG. 6 is a circuit diagram illustrating a level shifter circuit according further embodiments of the invention.

FIG. 6 is a circuit diagram illustrating a level shifter circuit 300 according further embodiments of the invention. Referring to FIG. 6, the level shifter circuit 300 includes an input buffer 10, a first switching circuit 11, a second switching circuit 12, a third switching circuit 31A, a level control circuit 13, an output buffer 20, a leakage current control circuit 42 and an output compensation circuit 41B.

The level shifter circuit 300 of FIG. 6 includes some elements similar to elements of the level shifter 100 of FIG. 3 except for the output compensation circuit 41B; therefore, descriptions of the function and operation of the elements included in level shifter circuit 300 of FIG. 6 that are in common with those of the level shifter circuit 100 of FIG. 3 may be omitted. The output buffer 20 may include a first inverter 25 having an input 25A coupled to the first output node N5 and an output 25B coupled to the second output node N7 and a second inverter 27 having an input 27A coupled to the second output node N7 and an output 27B coupled to the third output node N6.

The output compensation circuit 41B may include an inverter INV51 having an input 51A coupled to the second output node N7 and an output 51B coupled to the first output node N5. The inverter INV51 inverts a feedback signal of the output buffer 20 received from the second output node N7 and provides the inverted feedback signal to the first output node N5.

The operation of the level shifter circuit 300 shown in FIG. 6 is similar to the operation of the level shifter circuit 100 shown in FIG. 3. As the output compensation circuit 41B employs the inverter INV51 instead of the PMOS transistor MP41, when the first output signal (node N5) has a high level, the output compensation circuit 41B is able to maintain the high level of the first output signal.

Additionally, when the first output signal at node N5 changes to a low level, the inverter INV51 may form an additional current path and can increase the switching speed of the first output signal.

Figure 7:
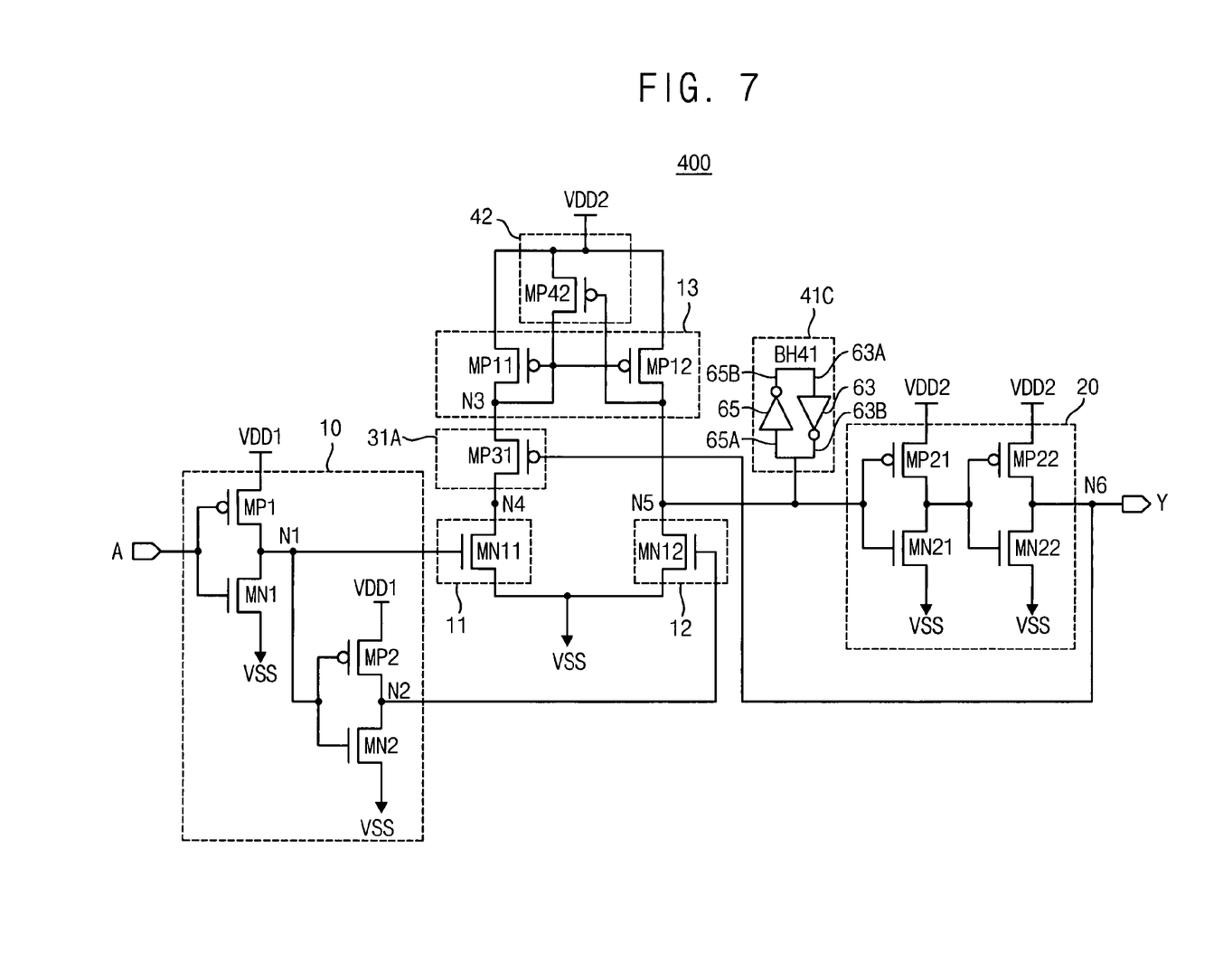
FIG. 7 is a circuit diagram illustrating a level shifter circuit according still further embodiments of the invention.

FIG. 7 is a circuit diagram illustrating a level shifter circuit 400 according further embodiments of the invention. Referring to the embodiments of FIG. 7, the level shifter circuit 400 includes an input buffer 10, a first switching circuit 11, a second switching circuit 12, a third switching circuit 31A, a level control circuit 13, an output buffer 20, a leakage current control circuit 42 and an output compensation circuit 41C.

The level shifter circuit 400 of FIG. 7 includes some elements similar to elements of the level shifter circuit 100 of FIG. 3 except for the output compensation circuit 41C; therefore, descriptions of the function and operation of the elements included in level shifter circuit 400 of FIG. 7 that are in common with the level shifter circuit 100 of FIG. 3 may be omitted.

The operation of the level shifter circuit 400 shown in FIG. 7 is similar to the operation of the level shifter circuit 100 shown in FIG. 3, except that the output compensation circuit 41C employs a bus holder circuit BH41 instead of the PMOS transistor MP41. As illustrated in FIG. 7, the bus holder circuit BH41 may include a first inverter 63 having an input 63A and an output 63B coupled to the first output node N5, and a second inverter 65 having an input 65A coupled to the first output node N5 and an output 65B coupled to the input 63A of the first inverter 63. Thus, the first inverter 63 and the second inverter 65 may be connected in an antiparallel configuration. The bus holder circuit BH41 may be able to maintain the state of a first output signal (node N5) without a feedback signal received from the output buffer 20.

When the first output signal at node N5 has a high level, the bus holder circuit BH41 maintains the first output signal at the high level, and when the first output signal has a low level, the bus holder circuit BH41 maintains the first output signal at the low level. Additionally, the bus holder circuit BH41 may have a latch structure which controls the change according to the state change of the output signal.

As described above, level shifter circuits having a current mirror structure have been described. However, some aspects of the invention may be applied to other digital circuits having current mirror structures in order to reduce leakage currents therein.

A level shifter or digital circuit according to some embodiments of the invention may reduce leakage currents by raising (or pulling-up) the gate voltage of a second PMOS transistor MP12 to a high power voltage using a switching operation of a PMOS transistor MP42 in a leakage current control circuit 42.

Furthermore, a level shifter or digital circuit according to some embodiments of the invention may reduce leakage currents in an output buffer by maintaining an output signal at the level of a power supply voltage.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A level shifter comprising
a first switching circuit configured to perform a switching operation in response to a first input signal swinging between a first voltage level and a second voltage level;
a second switching circuit configured to perform a switching operation in response to a second input signal having an inverted phase of the first input signal;
a level control circuit, coupled to a power voltage having a third voltage level, the level control circuit including an output terminal coupled to the second switching circuit and outputting a first output signal swinging between the first voltage level and the third voltage level to the output terminal based on the switching operations of the first switching circuit and the second switching circuit; and
a power compensation circuit configured to provide the power voltage having the third voltage level to the level control circuit in response to the first output signal to turn off an operation of the level control circuit;
wherein the level control circuit comprises:
a first PMOS transistor having a source coupled to the power voltage, a drain coupled to the first switching circuit and a gate coupled to the drain; and
a second PMOS transistor having a source coupled to the power voltage, a drain coupled to the output terminal and a gate coupled to the gate of the first PMOS transistor.

2. The level shifter of claim 1, wherein the power compensation circuit includes a third PMOS transistor having a source coupled to the power voltage, a gate coupled to the first output signal and a drain coupled to the gate of the first PMOS transistor and the gate of the second PMOS transistor.

3. The level shifter of claim 2, further comprising a third switching circuit switching between the first switching circuit and the level control circuit in response to a delayed signal of the first output signal.

4. The level shifter of claim 3, wherein the third switching circuit includes a fourth PMOS transistor having a gate coupled to the delayed signal of the first output signal.

5. The level shifter of claim 4, wherein the first switching circuit and the second switching circuit respectively include an NMOS transistor.

6. The level shifter of claim 2, further comprising a third switching circuit having an inverted phase of the first output signal, and the third switching circuit switching between the first switching circuit and the level control circuit in response to a delayed signal.

7. The level shifter of claim 6, wherein the third switching circuit includes a first NMOS transistor having a gate that has an inverted phase of the first output signal, and coupled to a delayed signal.

8. A level shifter comprising:
a first switching circuit configured to perform a switching operation in response to a first input signal swinging between a first voltage level and a second voltage level;
a second switching circuit configured to perform a switching operation in response to a second input signal having an inverted phase of the first input signal;
a level control circuit, coupled to a power voltage having a third voltage level, the level control circuit including an output terminal coupled to the second switching circuit, and outputting a first output signal swinging between the first voltage level and the third voltage level to the output terminal based on the switching operation of the first switching circuit and the second switching circuit;
an output buffer configured to receive the first output signal to generate a second output signal, a first feedback signal and the second feedback signal;
a third switching circuit configured to switch between the first switching circuit and the level control circuit in response to the first feedback signal; and
an output compensation circuit configured to provide the power voltage to the output terminal in response to the second feedback signal.

9. The level shifter of claim 8, wherein the output compensation circuit includes a third PMOS transistor having a source coupled to the power voltage, a drain coupled to the output terminal and a gate coupled to the second feedback signal.

10. The level shifter of claim 9, wherein the second feedback signal has an inverted phase of the first output signal.

11. The level shifter of claim 10, wherein the level control circuit comprises:
a first PMOS transistor having a source coupled to the power voltage, a drain coupled to the third switching circuit and a gate coupled to the drain; and
a second PMOS transistor having a source coupled to the power voltage, a drain coupled to the output terminal and a gate coupled to the gate of the first PMOS transistor.

12. The level shifter of claim 11, wherein the third switching circuit includes a first NMOS transistor having a gate coupled to the first feedback signal, wherein the first feedback signal has an inverted phase of the first output signal and includes a delayed signal of the first output signal.

13. The level shifter of claim 12, wherein the first switching circuit and the second switching circuit include an NMOS transistor.

14. The level shifter of claim 11, wherein the third switching circuit includes a fourth PMOS transistor having a gate coupled to the first feedback signal, wherein the first feedback signal has a phase identical with the first output signal and includes a delayed signal of the first output signal.

15. A level shifter comprising:
a first switching circuit configured to perform a switching operation in response to a first input signal swinging between a first voltage level and a second voltage level;
a second switching circuit configured to perform a switching operation in response to a second input signal having an inverted phase of the first input signal;
a level control circuit, coupled to a power voltage having a third voltage level, the level control circuit including an output terminal coupled to the second switching circuit and outputting a first output signal swinging between the first voltage level and the third voltage level to the output terminal based on the switching operation of the first switching circuit and the second switching circuit;
an output buffer configured to receive the first output signal to generate a second output signal and a first feedback signal;
a third switching circuit configured to switch between the first switching circuit and the level control circuit in response to the first feedback signal; and
a bus holder, coupled to the output terminal, configured to stabilize a level of the output terminal into the first voltage level and the third voltage level.

16. The level shifter of claim 15, wherein the bus holder includes a latch.

17. A level shifter comprising:
a first switching circuit configured to perform a switching operation in response to a first input signal swinging between a first voltage level and a second voltage level;
a second switching circuit configured to perform a switching operation in response to a second input signal having an inverted phase of the first input signal;
a level control circuit, coupled to a power voltage having a third voltage level, the level control circuit including an output terminal coupled to the second switching circuit and outputting a first output signal swinging between the first voltage level and the third voltage level to the output terminal based on the switching operation of the first switching circuit and the second switching circuit;
an output buffer configured to receive the first output signal to generate a second output signal, a first feedback signal and the second feedback signal;
a third switching circuit configured to switch between the first switching circuit and the level control circuit in response to the first feedback signal; and
an inverter configured to output an inverted signal of the second feedback signal to the output terminal in response to the second feedback signal.

18. The level shifter of claim 17, wherein the second feedback signal has an inverted phase of the first output signal.

19. A level shifter comprising:
a first switching circuit configured to perform a switching operation in response to a first input signal swinging between a first voltage level and a second voltage level;
a second switching circuit configured to perform a switching operation in response to a second input signal having an inverted phase of the first input signal;
a level control circuit, coupled to a power voltage having a third voltage level, the level control circuit including an output terminal coupled to the second switching circuit and outputting a first output signal swinging between the first voltage level and the third voltage level to the output terminal based on the switching operation of the first switching circuit and the second switching circuit;
a power compensation circuit configured to provide the power voltage to the level control circuit in response to the first output signal;
a third switching circuit configured to switch between the first switching circuit and the level control circuit in response to the first feedback signal; and
an output compensation circuit configured to provide the power voltage to the output terminal in response to the second feedback signal.

20. The level shifter of claim 19, wherein the level control circuit comprises:
a first PMOS transistor having a source coupled to the power voltage, a drain coupled to the third switching circuit a gate coupled to the drain; and
a second PMOS transistor having a source coupled to the power voltage, a drain coupled to the output terminal and a gate coupled to the gate of the first PMOS transistor.

21. The level shifter of claim 20, wherein the power compensation circuit includes a third PMOS transistor having a source coupled to the power voltage, a gate coupled to the first output signal and a drain coupled to the gate of the first PMOS transistor and the gate of the second PMOS transistor.

22. The level shifter of claim 19, wherein the output compensation circuit includes a third PMOS transistor having a source coupled to the power voltage, a drain coupled to the output terminal and a gate coupled to the second feedback signal.

23. The level shifter of claim 22, wherein the second feedback signal has an inverted phase of the first output signal.

24. A level shifter comprising:
a transistor pair having a source commonly coupled to a ground voltage, complementarily driving the first node and the second node by receiving an input signal swinging between a first power voltage and the ground voltage via the first node and by receiving a signal having an inverted phase of the input signal via the second node;
a current mirror having a source commonly coupled to a second power voltage whose level is different from a level of the first power voltage, and providing a first current signal to the second node, the first current signal corresponding to a mirror current of a second current signal provided to a third node;
an output buffer, coupled to the second node, configured to provide a first feedback signal, a second feedback signal and an output signal;
a first transistor, coupled between the first node and the third node, configured to be turned on/off in response to the first feedback signal;
a first PMOS transistor having a source coupled to the second power voltage, a drain coupled to transistor gates of the current mirror and a gate coupled to the second node; and
a second PMOS transistor having a source coupled to the second power voltage, a drain coupled to the second node and a gate coupled to the second feedback signal.

25. The level shifter of claim 24, wherein the second feedback signal has an inverted phase of a signal of the second node.

26. The level shifter of claim 25, wherein the first transistor includes an NMOS transistor, and the first feedback signal has an inverted phase of a signal of the second node.

27. The level shifter of claim 25, wherein the first transistor includes a PMOS transistor, and the first feedback signal has an identical phase of a signal of the second node.

28. A level shifter comprising:
a first NMOS transistor having a gate coupled to an input signal;
a second NMOS transistor having a gate coupled to an inverted input signal;
a first PMOS transistor having a source coupled to a power voltage, and a gate coupled to a drain;
a second PMOS transistor having a source coupled to the power voltage, a gate coupled to the gate of the first PMOS transistor and a drain coupled to the drain of the second NMOS transistor:
an inverter, coupled to the drain of the second NMOS transistor and the drain of the second PMOS transistor, configured to generate an output signal;
a third NMOS transistor having a drain coupled to the drain of the first PMOS transistor, a source coupled to the drain of the first NMOS transistor and a gate coupled to the output signal;
a third PMOS transistor having a source coupled to the power voltage, a drain coupled to the gate of the first PMOS transistor and the gate of the second PMOS transistor and a gate coupled to the drain of the second PMOS transistor and the drain of the second NMOS transistor; and
a fourth PMOS transistor having a source coupled to the power voltage, a drain coupled to the drain of the second PMOS transistor and the drain of the second NMOS transistor, a gate coupled to the output signal.

29. A level shifter comprising:
a first NMOS transistor having a gate coupled to an input signal;
a second NMOS transistor having a gate coupled to an inverted input signal;
a first PMOS transistor having a source coupled to a power voltage, and a gate coupled to a first PMOS transistor;
a second PMOS transistor having a source coupled to the power voltage, a gate coupled to the gate of the first PMOS transistor and a drain coupled to the drain of the second NMOS transistor;
a first inverter, coupled to a drain of the second NMOS transistor and a drain of the second PMOS transistor, configured to generate a first signal;
a second inverter configured to receive the first signal to generate an output signal;
a third PMOS transistor having a source coupled to a drain of the first PMOS transistor, a drain coupled to a drain of the first NMOS transistor and a gate coupled to the output signal;
a fourth PMOS transistor having a source coupled to the power voltage, a drain coupled to a gate of the first PMOS transistor and a gate of the second PMOS transistor and a gate coupled to a drain of the second PMOS transistor and a drain of the second NMOS transistor; and
a fifth PMOS transistor having a source coupled to the power voltage, a drain coupled to a gate of the first PMOS transistor and a gate of the second PMOS transistor and a gate coupled to the first signal.

30. A digital circuit comprising:
a switching circuit including a first transistor and a second transistor having a common source configuration, the first transistor and the second transistor are switched in response to a first input signal and a second input signal having an inverted phase of the first input signal, respectively;
a current mirror having a first PMOS transistor and a second PMOS transistor coupled to a power voltage having a first voltage level, and the current mirror providing a first output signal to an output terminal based on a voltage level of the first input signal and the second input signal; and
a leakage current control circuit configured to prevent a leakage current of the current mirror by providing the power voltage to control electrodes of the first PMOS transistor and the second PMOS transistor in response to the first output signal to turn off the current mirror.

31. The digital circuit of claim 30, wherein the leakage current control circuit includes a PMOS transistor having a first current electrode coupled to the power voltage, a control electrode coupled to the output terminal and a second current electrode commonly coupled to a control electrode of the first PMOS transistor and the second PMOS transistor.

32. The digital circuit of claim 30, wherein the digital circuit having a mirror structure comprises:
a first inverter configured to invert the first output signal to generate a feedback signal; and
a second inverter configured to invert the feedback signal to generate a second output signal.

33. The digital circuit of claim 32, wherein the digital circuit having a mirror structure further comprises a switching element switching between the current mirror and the first transistor in response to the second output signal.

34. The digital circuit of claim 33, wherein the digital circuit having a mirror structure further comprises an output compensation circuit that maintains a voltage level of an output terminal substantially at the power voltage level in response to the feedback signal when a first transistor is turned on.

35. The digital circuit of claim 34, wherein the output compensation circuit includes a PMOS transistor having a control electrode where the feedback signal is provided, a first current electrode coupled to the power voltage and a second current electrode coupled to the output terminal.

36. A digital circuit comprising:
first and second input nodes;
a power supply terminal having a power supply voltage;
a switching circuit including a first switching transistor and a second switching transistor having a common source configuration, the first switching transistor having a control terminal coupled to the first input node and the second switching transistor having a control terminal coupled to the second input node, the states of the first switching transistor and the second switching transistor being switched in response to a first input signal at the first input node and an inverted first input signal at the second input node;
a current mirror including a first current supply transistor having a control electrode and having a current terminal coupled to the power supply terminal and a second current supply transistor having a control electrode coupled to the control electrode of the first transistor and having a current terminal coupled to the power supply terminal, the current mirror providing a first output signal to a first output node based on a state of the first switching transistor and a complementary state of the second switching transistor; and a leakage current control circuit coupled to the first output node and the current mirror and configured to selectively couple the power supply terminal to the control electrodes of the first current supply transistor and the second current supply transistor in response to the first output signal.

37. The digital circuit of claim 36, wherein the first switching transistor and the second switching transistor comprise NMOS transistors.

38. The digital circuit of claim 36, wherein the first current supply transistor and the second current supply transistor comprise PMOS transistors.

39. The digital circuit of claim 38, wherein the leakage current control circuit comprises a PMOS transistor having a gate terminal coupled to the first output node, a source terminal coupled to the power supply terminal, and a drain terminal coupled to the control terminals of the first and second current supply transistors.

40. The digital circuit of claim 36, further comprising:
an output buffer coupled to the first output node and configured to provide a delayed output signal to a second output node; and
a current switch coupled between the first switching transistor and the first current supply transistor and configured to switch a current from the current mirror in response to a level of the delayed output signal.

41. The digital circuit of claim 40, wherein the current switch comprises a transistor having a first current terminal coupled to the first current supply transistor, a second current terminal coupled to the first switching transistor, and a control terminal coupled to the second output node.

42. The digital circuit of claim 41, wherein the current switch comprises a PMOS transistor.

43. The digital circuit of claim 41, wherein the current switch comprises an NMOS transistor and the delayed output signal is delayed and inverted with respect to the first output signal.

44. The digital circuit of claim 36, further comprising an output compensation circuit coupled to the first output node and configured to maintain a voltage level of the first output node based on a level of the first output signal.

45. The digital circuit of claim 44, further comprising:
an output buffer coupled to the first output node and configured to provide a delayed and inverted output signal to a second output node;
wherein the output compensation circuit is configured to supply a voltage to the first output node in response to a level of the delayed and inverted output signal.

46. The digital circuit of claim 45, wherein the output compensation circuit comprises a PMOS transistor having a source coupled to the power supply terminal, a drain coupled to the first output node and a gate coupled to the second output node.

47. The digital circuit of claim 45, wherein the output compensation circuit comprises an inverter circuit having an input coupled to the second output node and an output coupled to the first output node.

48. The digital circuit of claim 44, wherein the output compensation circuit comprises a pair of inverter circuits connected in an anti-parallel configuration.

49. A digital circuit comprising:
first and second input nodes;
a power supply terminal having a power supply voltage;
a switching circuit including a first switching transistor and a second switching transistor having a common source configuration, the first switching transistor having a control terminal coupled to the first input node and the second switching transistor having a control terminal coupled to the second input node, the states of the first switching transistor and the second switching transistor being switched in response to a first input signal at the first input node and an inverted first input signal at the second input node;

a current mirror including a first current supply transistor having a control electrode and having a current terminal coupled to the power supply terminal and a second current supply transistor having a control electrode coupled to the control electrode of the first transistor and having a current terminal coupled to the power supply terminal, the current mirror providing a first output signal to a first output node based on a state of the first switching transistor and a complementary state of the second switching transistor; and an output compensation circuit coupled to the first output node and configured to maintain a voltage level of the first output node based on a level of the first output signal.

50. The digital circuit of claim 49, further comprising:
an output buffer coupled to the first output node and configured to provide a delayed and inverted output signal at a second output node;
wherein the output compensation circuit is configured to supply a voltage to the first output node in response to a level of the delayed and inverted output signal.

51. The digital circuit of claim 50, wherein the output compensation circuit comprises a PMOS transistor having a source coupled to the power supply terminal, a drain coupled to the first output node and a gate coupled to the second output node.

52. The digital circuit of claim 50, wherein the output compensation circuit comprises an inverter circuit having an input coupled to the second output node and an output coupled to the first output node.

53. The digital circuit of claim 49, wherein the output compensation circuit comprises a pair of inverter circuits connected in an anti-parallel configuration.

54. A digital circuit comprising:
first and second input nodes;
a power supply terminal having a power supply voltage;
a first NMOS transistor and a second NMOS transistor having a common source configuration, the first NMOS transistor having a gate coupled to the first input node and the second NMOS transistor having a gate coupled to the second input node and a drain coupled to a first output node;
a first PMOS transistor having a gate, a source terminal coupled to the power supply terminal, and a drain coupled to a drain of the first NMOS transistor and to the gate of the first PMOS transistor;
a second PMOS transistor having a gate coupled to the gate of the first PMOS transistor and having a source coupled to the power supply terminal and a drain coupled to the first output node; and
a third PMOS transistor having a source coupled to the power supply terminal, a drain coupled to the gates of the first and second PMOS transistors and a gate coupled to the first output node.

55. The digital circuit of claim 54, further comprising a first inverter having an input coupled to the first output node and an output coupled to a second output node; and a fourth PMOS transistor having a source coupled to the power supply terminal, a drain coupled to the first output node and a gate coupled to the second output node.

56. The digital circuit of claim 54, further comprising a first inverter having an input coupled to the first output node and an output coupled to a second output node; and
a second inverter having an input coupled to the second output node and an output coupled to a third output node.

57. The digital circuit of claim 54, further comprising a pair of inverter circuits connected in an anti-parallel configuration and coupled to the first output node.

58. The digital circuit of claim 54, further comprising a first inverter having an input coupled to the first output node and an output coupled to a second output node;
a second inverter having an input coupled to the second output node and an output coupled to a third output node; and
a fourth PMOS transistor having a source coupled to the drain of the first PMOS transistor and a drain coupled to the drain of the first NMOS transistor, and a gate coupled to the third output node.

59. The digital circuit of claim 54, further comprising:
a first inverter having an input coupled to the first output node and an output coupled to a second output node; and
a third NMOS transistor having a drain coupled to the drain of the first PMOS transistor, a source coupled to the drain of the first NMOS transistor, and a gate coupled to the second output node.

60. A digital circuit comprising:
first and second input nodes;
a power supply terminal having a power supply voltage;
a first NMOS transistor and a second NMOS transistor having a common source configuration, the first NMOS transistor having a gate coupled to the first input node and the second NMOS transistor having a gate coupled to the second input node and a drain coupled to a first output node;
a first PMOS transistor having a gate, a source terminal coupled to the power supply terminal, and a drain coupled to a drain of the first NMOS transistor and to the gate of the first PMOS transistor;
a second PMOS transistor having a gate coupled to the gate of the first PMOS transistor and having a source coupled to the power supply terminal and a drain coupled to the first output node; and
an output compensation circuit coupled to the first output node and configured to maintain a voltage level of the first output node.

61. The digital circuit of claim 60, further comprising a first inverter having an input coupled to the first output node and an output coupled to a second output node; wherein the output compensation circuit comprises a fourth PMOS transistor having a source coupled to the power supply terminal, a drain coupled to the first output node and a gate coupled to the second output node.

62. The digital circuit of claim 60, wherein the output compensation circuit comprises a first inverter having an input coupled to the first output node and a second inverter having an input coupled to an output of the first inverter and an output coupled to the first output node.

63. The digital circuit of claim 60, further comprising a first inverter having an input coupled to the first output node and an output coupled to a second output node;
a second inverter having an input coupled to the second output node and an output coupled to a third output node; and
a fourth PMOS transistor having a source coupled to the drain of the first PMOS transistor and a drain coupled to the drain of the first NMOS transistor and a gate coupled to the third output node.

64. The digital circuit of claim 60, further comprising:
a first inverter having an input coupled to the first output node and an output coupled to a second output node; and
a third NMOS transistor having a drain coupled to the drain of the first PMOS transistor, a source coupled to the drain of the first NMOS transistor, and a gate coupled to the second output node.

65. The digital circuit of claim 60, further comprising a first inverter having an input coupled to the first output node and an output coupled to a second output node; wherein the output compensation circuit comprises a second inverter having an input coupled to the second output node and an output coupled to the first output node.

66. A level shifter circuit comprising:
a first input node configured to receive an input signal having a signal level that switches between a first voltage level and a second voltage level;
a first inverter having an input coupled to the first input node and configured to provide an inverted input signal at a second input node;
a power supply terminal having a third voltage level different from the first and second voltage levels;
a switching circuit including a first switching transistor and a second switching transistor having a common source configuration, the first switching transistor having a control terminal coupled to the first input node and the second switching transistor having a control terminal coupled to the second input node, the states of the first switching transistor and the second switching transistor being switched in response to the input signal at the first input node and the inverted input signal at the second input node;
a current mirror including a first current supply transistor having a control electrode and having a current terminal coupled to the power supply terminal and a second current supply transistor having a control electrode coupled to the control electrode of the first transistor and having a current terminal coupled to the power supply terminal, the current mirror providing a first output signal switching between the second voltage level and the third voltage level to an output node based on a state of the first switching transistor and a complementary state of the second switching transistor; and
a leakage current control circuit coupled to the output node and the current mirror and configured to selectively couple the power supply terminal to the control electrodes of the first current supply transistor and the second current supply transistor in response to the first output signal.

67. The level shifter circuit of claim 66, further comprising an output compensation circuit coupled to the output node and configured to maintain a voltage level of the output node based on a level of the first output signal.

68. A level shifter circuit comprising:
a first input node configured to receive an input signal having a signal level that switches between a first voltage level and a second voltage level;

a first inverter having an input coupled to the input node and configured to provide an inverted input signal at a second input node;

a power supply terminal having a third voltage level different from the first and second voltage levels;

a switching circuit including a first switching transistor and a second switching transistor having a common source configuration, the first switching transistor having a control terminal coupled to the first input node and the second switching transistor having a control terminal coupled to the second input node, the states of the first switching transistor and the second switching transistor being switched in response to the input signal at the first input node and the inverted input signal at the second input node;

a current mirror including a first current supply transistor having a control electrode and having a current terminal coupled to the power supply terminal and a second current supply transistor having a control electrode coupled to the control electrode of the first transistor and having a current terminal coupled to the power supply terminal, the current mirror providing a first output signal switching between the second voltage level and the third voltage level to an output node based on a state of the first switching transistor and a complementary state of the second switching transistor; and an output compensation circuit coupled to the output node and configured to maintain a voltage level of the output node based on a level of the first output signal.

69. A level shifter circuit comprising:

a first input node configured to receive an input signal having a signal level that switches between a first voltage level and a second voltage level;

a first inverter having an input coupled to the input node and configured to provide an inverted input signal at a second input node;

a power supply terminal having a third voltage level different from the first and second voltage levels;

a first NMOS transistor and a second NMOS transistor having a common source configuration, the first NMOS transistor having a gate coupled to the first input node and the second NMOS transistor having a gate coupled to the second input node and a drain coupled to a first output node;

a first PMOS transistor having a gate, a source terminal coupled to the power supply terminal, and a drain coupled to a drain of the first NMOS transistor and to the gate of the first PMOS transistor;

a second PMOS transistor having a gate coupled to the gate of the first PMOS transistor and having a source coupled to the power supply terminal and a drain coupled to the first output node to thereby provide a first output signal to the first output node that switches between the second voltage level and the third voltage level; and a third PMOS transistor having a source coupled to the power supply terminal, a drain coupled to the gates of the first and second PMOS transistors and a gate coupled to the first output node.

70. The level shifter circuit of claim 69, further comprising an output compensation circuit coupled to the first output node and configured to maintain a voltage level of the first output node based on a level of the first output signal.

* * * * *